United States Patent
Rouh et al.

(10) Patent No.: US 7,470,593 B2
(45) Date of Patent: Dec. 30, 2008

(54) METHOD FOR MANUFACTURING A CELL TRANSISTOR OF A SEMICONDUCTOR MEMORY DEVICE

(75) Inventors: Kyoung Bong Rouh, Goyang-si (KR); Seung Woo Jin, Icheon-si (KR); Min Young Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 417 days.

(21) Appl. No.: 11/150,026

(22) Filed: Jun. 10, 2005

(65) Prior Publication Data

US 2006/0141716 A1 Jun. 29, 2006

(30) Foreign Application Priority Data

Dec. 29, 2004 (KR) .................. 10-2004-0114740

(51) Int. Cl.
*H01L 21/336* (2006.01)
(52) U.S. Cl. .................. 438/289; 438/306; 438/527
(58) Field of Classification Search .......... 438/289, 438/306, 527
See application file for complete search history.

(56) References Cited

U.S. PATENT DOCUMENTS

| 5,898,007 A | 4/1999 | Lee |
| 6,251,718 B1 | 6/2001 | Akamatsu et al. |
| 6,312,981 B1 | 11/2001 | Akamatsu et al. |
| 7,105,414 B2 * | 9/2006 | Kim .......................... 438/306 |

* cited by examiner

*Primary Examiner*—Carl Whitehead, Jr.
*Assistant Examiner*—Colleen E Rodgers
(74) *Attorney, Agent, or Firm*—Marshall, Gerstein & Borun LLP

(57) ABSTRACT

Disclosed is a method for manufacturing a cell transistor of a semiconductor memory device. The method comprises the steps of: forming device isolation films and a well on a semiconductor substrate; forming a threshold voltage adjust region by ion-implanting a first conductive impurity dopant into the well of the semiconductor substrate; performing a first thermal annealing on the semiconductor substrate where the threshold voltage adjust region is formed; forming a gate insulating film and gate electrodes on top of the semiconductor substrate between the device isolation films; forming a halo ion implantation region by ion-implanting a first conductive impurity dopant into the semiconductor substrate corresponding to a drain region exposed by the gate electrodes; performing a second thermal annealing on the semiconductor substrate where the halo ion implantation region is formed; and forming source/drain regions by ion-implanting a second conductive impurity dopant into the semiconductor substrate exposed by the gate electrodes. This method can reduce the turn-off leakage current of the cell transistor since the dopant dose of the threshold voltage adjust region can be reduced while maintaining the threshold voltage by increasing the dopant diffusion of the threshold voltage adjust region.

6 Claims, 3 Drawing Sheets

METHOD FOR MANUFACTURING A CELL TRANSISTOR OF A SEMICONDUCTOR MEMORY DEVICE

BACKGROUND OF THE INVENTION

1. Field of the Invention

The present invention relates to a method for manufacturing a semiconductor memory device, and more particularly, to a method for manufacturing a cell transistor of a semiconductor memory device, which is able to suppress turn-off leakage current by adjusting the threshold voltage of a cell transistor such as a DRAM or the like.

2. Description of Related Art

Generally, a semiconductor device employing a transistor with a MOS (metal oxide semiconductor) structure creates a short channel effect since the critical dimension of a gate electrode continues to be smaller along with the high integration of the device. To suppress this short channel effect, impurities for threshold voltage adjustment are implanted into a channel region of the transistor, which, however reaches its limit as the integration degree increases.

FIG. 1 is a vertical cross sectional view showing a cell structure of a semiconductor memory device in the prior art. Referring to this, a conventional method for manufacturing a cell transistor with a MOS structure will be described.

Firstly, STI (shallow trench isolation) type device isolation films 12 for defining an active region and a non-active region as a device isolation region are formed on a silicon substrate as a semiconductor substrate 10.

A well ion implantation and an ion implantation processes for threshold voltage (Vt) adjustment are performed on the semiconductor substrate between the device isolation films 12. At this time, in the ion implantation for threshold voltage adjustment, if the cell transistor is a NMOS, a p-type impurity dopant is ion-implanted, and if a PMOS, an n-type impurity dopant is ion-implanted.

And, a silicon oxide film ($SiO_2$) is deposited as a gate insulating film 14 on the entire surface of the semiconductor substrate 10, and a doped polysilicon film 16 and metal silicide (for example, tungsten silicide or the like) 18 are sequentially deposited as a gate conductive film thereon. Then, the metal silicide 18 and the doped polysilicon film 16 are patterned by a photographing and etching process to form gate electrodes.

Continually, a silicon nitride film ($Si_3N_4$) is deposited as an insulating material on the entire surface of the substrate where the gate electrodes are formed, and thereafter etched by an overall etchback process, thereby forming space insulating films 20 on sides of the gate electrodes 16 and 18.

Then, a n-type or p-type impurity dopant (for example, P, As, B) is ion-implanted into the semiconductor substrate exposed between the spacer insulating films 20 of the gate electrodes 16 and 18 or between the spacer insulating films 20 and the device isolation films 12, to form source/drain regions 22.

As above, in the method for manufacturing a cell transistor with a MOS structure in the prior art, since channel resistance becomes lower due to a short channel effect with the high integration of a semiconductor device, an ion implantation process is carried out at an increased dose of an impurity dopant for threshold voltage adjustment in order to increase threshold voltage.

However, if the dose of the impurity dopant for threshold voltage adjustment is increased as above, the self-resistance (Rs) and contact resistance (Rc) of the source/drain regions in a narrow surface area become higher, thereby increasing turn-off leakage current. With an increase in the dose of impurity dopants of a threshold voltage adjust region, turn-off leakage current is increased, which makes it difficult for a DRAM or the like to obtain a desired TWR (time of writing recovery) time, and accordingly deteriorates the refresh operation in the DRAM.

SUMMARY OF THE INVENTION

Accordingly, it is an object of the present invention to overcome the conventional disadvantages and to provide a method for manufacturing a cell transistor of a semiconductor memory device, which can reduce the turn-off leakage current of the cell transistor since the dopant dose of a threshold voltage adjust region can be reduced while maintaining a threshold voltage by carrying out a first thermal annealing process after ion-implantation of the impurity dopant for threshold voltage adjustment, and then carrying out a second thermal annealing process after halo ion implantation.

To achieve the above object, there is provided a method for manufacturing a cell transistor of a semiconductor memory device having a threshold voltage adjusting region on a semiconductor substrate according to the present invention, comprising the steps of: forming device isolation films and a well on a semiconductor substrate; forming a threshold voltage adjust region by ion-implanting a first conductive impurity dopant into the well of the semiconductor substrate; performing a first thermal annealing on the semiconductor substrate where the threshold voltage adjust region is formed; forming a gate insulating film and gate electrodes on top of the semiconductor substrate between the device isolation films; forming a halo ion implantation region by ion-implanting a first conductive impurity dopant into the semiconductor substrate corresponding to a drain region exposed by the gate electrodes; performing a second thermal annealing on the semiconductor substrate where the halo ion implantation region is formed; and forming source/drain regions by ion-implanting a second conductive impurity dopant into the semiconductor substrate exposed by the gate electrodes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
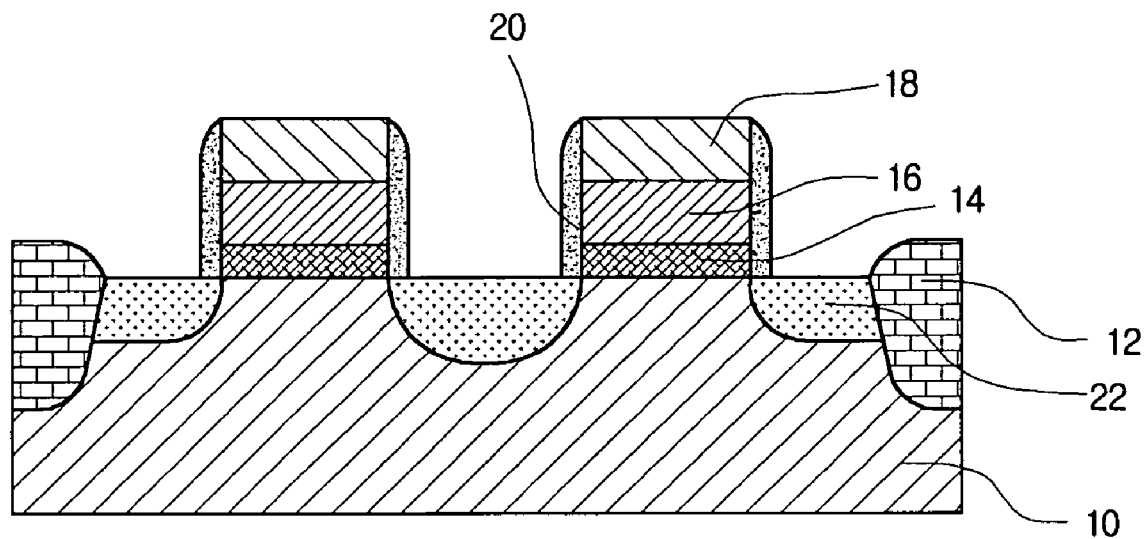
FIG. 1 is a vertical cross sectional view showing a cell structure of a semiconductor memory device in the prior art.

A preferred embodiment of the present invention will now be described in detail with reference to the accompanying drawings so that those skilled in the art may readily practice the invention.

In the drawings, thickness is shown to be greater in order to clearly represent multiple layers and regions.

Throughout the specification, like parts are denoted by like reference numerals.

Figure 2:
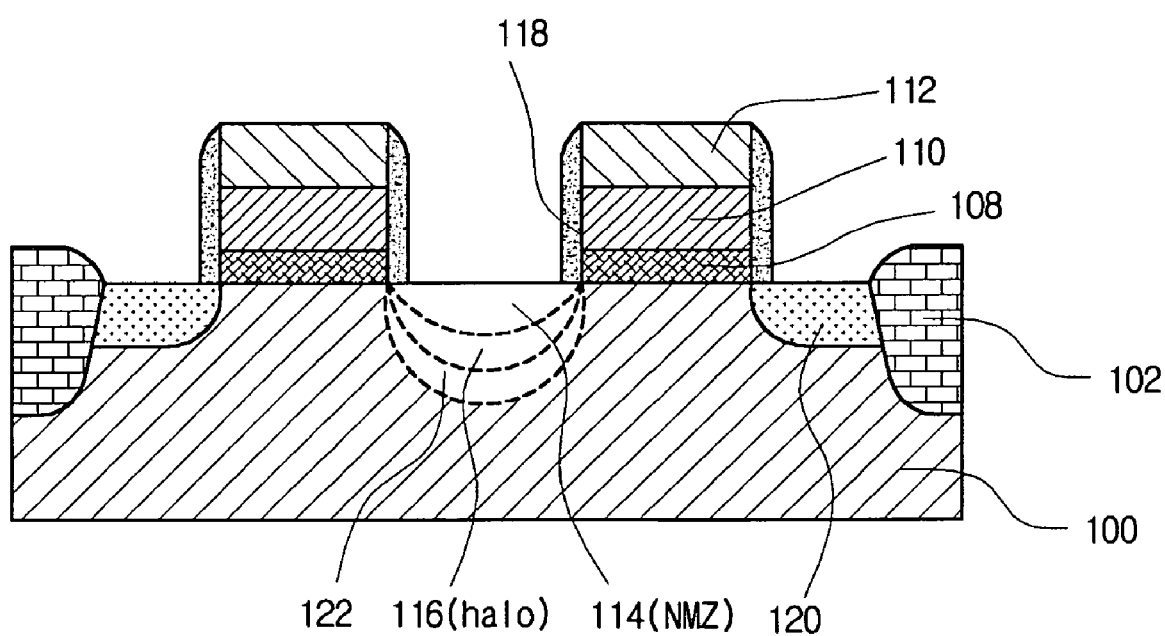
FIG. 2 is a vertical cross sectional view showing a cell structure of a semiconductor memory device manufactured according to the present invention.

FIG. 2 is a vertical cross sectional view showing a cell structure of a semiconductor memory device manufactured according to the present invention.

Referring to FIG. 2, in the cell transistor of the semiconductor memory device manufactured according to the present invention, STI type device isolation films 102 for defining an active region and a non-active region as a device isolation region are formed on a silicon substrate as a semiconductor substrate 100. A well (not shown) implanted with a first conductive impurity dopant (for example, a p-type dopant) is formed on the semiconductor substrate between the device isolation films 102, and a threshold voltage (Vt) adjust region (not shown) implanted with a first conductive impurity dopant (for example, a p-type dopant) is formed in the semiconductor substrate 100. At this time, in the ion implantation for threshold voltage adjustment, if the cell transistor is a NMOS, the p-type impurity dopant is ion-implanted, and if a PMOS, the n-type impurity dopant is ion-implanted.

And, a silicon oxide film ($SiO_2$) is deposited as a gate insulating film 108 on the entire surface of the semiconductor substrate 100, and a doped polysilicon film 110 and metal silicide (for example, tungsten silicide or the like) 112 as a gate conductive film are patterned to form gate electrodes.

Spacer insulating films 118 made of insulating material such as a silicon nitride film ($Si_3N_4$) are formed on the sides of the gate electrodes 110 and 112. Source/drain regions 120 and 122 implanted with a second conductive impurity dopant (for example, an n-type dopant) are formed in the semiconductor substrate exposed between the spacer insulating films 118 of the gate electrodes 110 and 112 or between the spacer insulating films 118 and the device isolation films 102.

Meanwhile, gates including the gate electrodes 110 and 112 are applicable to recess gates (stepped gates or trench gates) for increasing the length of the channels.

Further, a NM2 ion implantation region 114 implanted with a second conductive impurity dopant (for example, an n-type dopant) is formed on the surface of the semiconductor substrate in the drain region 122, and a halo ion implantation region 116 implanted with a first conductive impurity dopant (for example, a p-type dopant) is formed between the NM2 ion implantation region 114 and the drain region 122.

As above, the cell transistor of a semiconductor memory device, for example, a DRAM, manufactured according to the present invention can maintain a preset threshold voltage while reducing the dose of the dopant in the threshold voltage adjust region. This is because the diffusion of the dopant of the threshold voltage adjust region can be increased by carrying out a first thermal annealing process after the ion-implantation of the impurity dopant for threshold voltage adjustment, and then carrying out a second thermal annealing process after the halo ion implantation. Consequently, the cell transistor of this invention can increase the threshold voltage (Vtsat) by approximately more than 200 mV under the condition of the same dopant dose in the threshold voltage adjust region as in the prior art. Under the condition of the same threshold voltage (Vtsat) as in the prior art, the dopant dose in the threshold voltage adjust region can be reduced by approximately 2.5E12 to 3.5E12.

FIGS. 3a to 3e are process charts for explaining a method for manufacturing a cell of a semiconductor memory device according to one embodiment of the present invention. Referring to these drawings, a process for manufacturing a cell transistor according to the present invention will be exemplified.

Figure 3A:
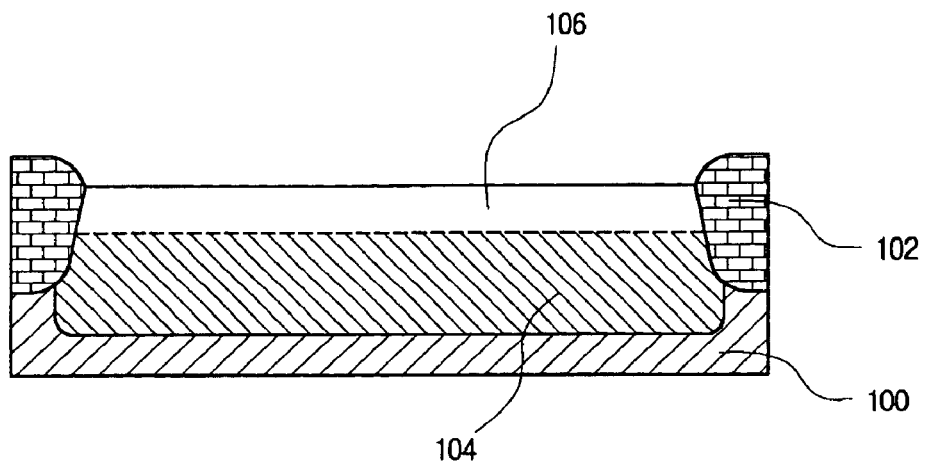
FIGS. 3a to 3e are process charts for explaining a method for manufacturing a cell of a semiconductor memory device according to one embodiment of the present invention.

Firstly, as shown in FIG. 3a, STI type device isolation films 102 for defining an active region and a non-active region are formed on a silicon substrate as a semiconductor substrate 100. A first conductive impurity dopant (for example, a p-type dopant) is ion-implanted into the semiconductor substrate between the device isolation films 102 to form a well 104. A threshold voltage adjust region 106 implanted with a first conductive impurity dopant (for example, a p-type dopant) is formed in the semiconductor substrate 100. At this time, in the ion implantation for threshold voltage adjustment, if the cell transistor is a NMOS, a p-type impurity dopant is ion-implanted, and if a PMOS, a n-type impurity dopant is ion-implanted.

For example, the threshold voltage adjust region 106 is ion-implanted with 11B, 49BF2, or 30BF in case of using a p-type dopant. Otherwise, it is ion-implanted with P or As in case of using a n-type dopant. Further, ion implantation is carried out at a dopant dose of 1.5E12 to 2E12 of the threshold voltage adjust region 106.

Figure 3B:
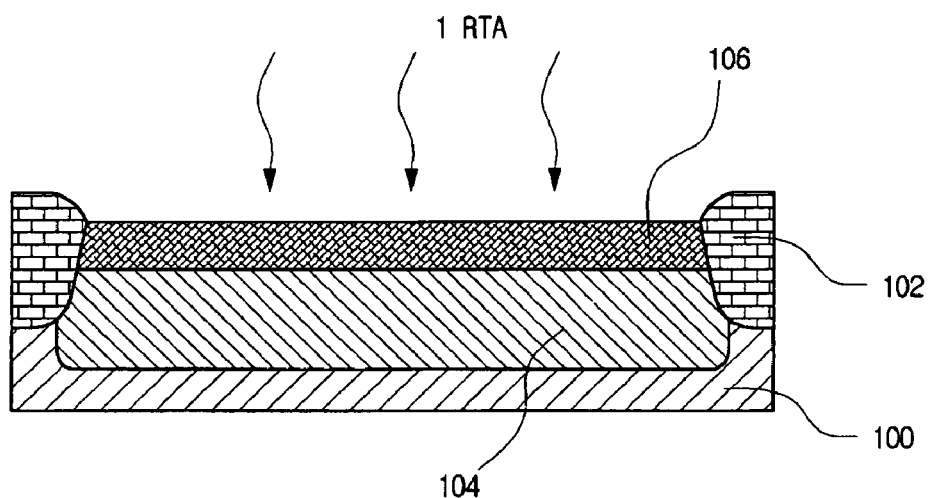

As shown in FIG. 3b, a first thermal annealing is performed on the semiconductor substrate where the threshold voltage adjust region is formed, thereby diffusing the dopant of the threshold voltage adjust region 106. At this time, the first thermal annealing is performed by a RTA (rapid thermal anneal) process for 0.1 to 120 seconds at a temperature from 800 to 1200° C. Further, the first thermal annealing is performed at a ramp up and ramp down temperature ranging from 20 to 300° C./sec while additionally implanting a non-active gas such as Ar, $N_2$, or the like.

Figure 3C:
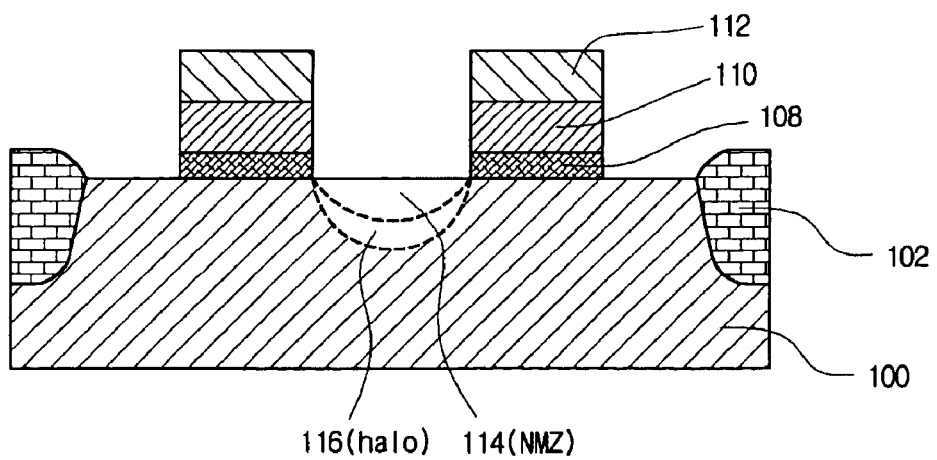

Next, as shown in FIG. 3c, a silicon oxide film ($SiO_2$) is deposited as a gate insulating film 108 on the entire surface of the semiconductor substrate 100, and a doped polysilicon film 110 and metal silicide (for example, tungsten silicide or the like) 112 are sequentially deposited thereon. Then, the metal silicide 112 and the doped polysilicon film 110 are patterned by a photographic and etching process using a gate mask to form gate electrodes 110 and 112.

A first conductive impurity dopant is ion-implanted into the semiconductor substrate corresponding to the drain region exposed by the gate electrodes 110 and 112, to form a halo ion implantation region 116. At this time, before forming the halo ion implantation region 116, a NM2 ion implantation region 114 implanted with a second conductive impurity dopant (for example, an n-type dopant) may be additionally formed on the surface of the semiconductor substrate 100 in the drain region.

For example, the halo ion implantation region 116 is ion-implanted with 11B, 49BF2, or 30BF in case of using a p-type dopant. The dopant dose is 1.5E12 to 2E12. The NM2 ion implantation region 114 is ion-implanted with P or As in case of using a n-type dopant.

The halo ion implantation region 116 serves to adjust the threshold voltage of a drain region in a cell transistor, especially, in a cell transistor having a junction structure in which a source region and a drain region are asymmetrical, and the NM2 ion implantation region 114 serves to reduce the contact resistance of the drain region.

Figure 3D:
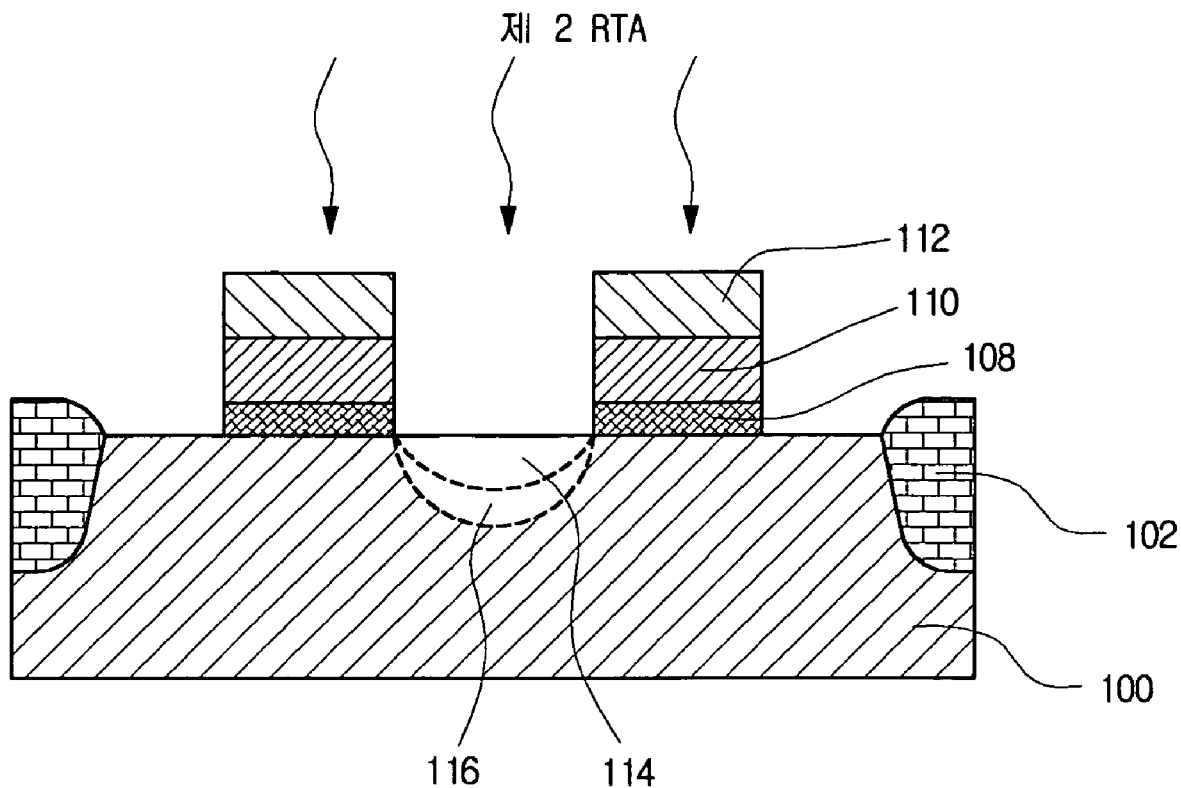

Continuously, as shown in FIG. 3d, a second thermal annealing is performed on the semiconductor substrate 100 where the halo ion implantation region 116 is formed, thereby diffusing the dopant of the halo ion implantation region 116 and NM2 ion implantation region 114, and simultaneously diffusing the dopant of the threshold voltage adjust region once again. At this time, the second thermal annealing is performed by a RTA process for 0.1 to 120 seconds at a temperature from 800 to 1200° C. Further, the second thermal annealing is performed at a ramp up and ramp down temperature ranging from 20 to 300° C./sec while additionally implanting a non-active gas such as Ar, $N_2$, or the like.

Figure 3E:
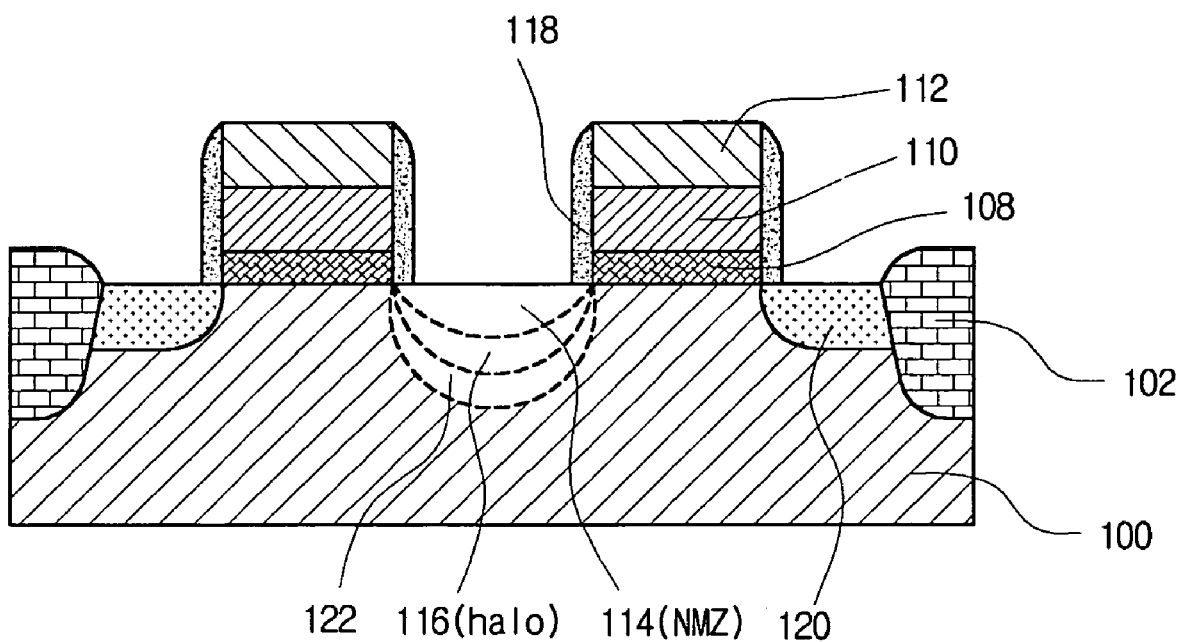

Then, as shown in FIG. 3e, a silicon nitride film (Si$_3$N$_4$) as insulating material is deposited on the entire surface of the substrate 100 where the gate electrodes 100 and 112 are formed, and then is etched by an overall etching process, thereby forming spacer insulating films 118 on sides of the gate electrodes 110 and 112. Thereafter, source/drain regions 120 and 122 implanted with a second conductive impurity dopant (for example, an n-type dopant) are formed in the semiconductor substrate 100 exposed between the spacer insulating films 118 of the gate electrodes 110 and 112 or between the spacer insulating films 118 and the device isolation films 102.

Resultantly, in the method for manufacturing a cell transistor of a semiconductor memory device, for example, a DRAM according to the present invention, the diffusion of the dopant of the threshold voltage adjust region can be greatly increased by two stages of the a thermal annealing process by carrying out a first thermal annealing process after the ion-implantation of the impurity dopant for threshold voltage adjustment, and then carrying out a second thermal annealing process after the halo ion implantation. Consequently, the cell transistor of this invention can increase the threshold voltage (Vtsat) by approximately more than 200 mV under the condition of the same dopant dose in the threshold voltage adjust region as in the prior art. Under the condition of the same threshold voltage (Vtsat) of approximately 0.6V as in the prior art, the dopant dose in the threshold voltage adjust region can be reduced.

Especially, in a cell transistor having an asymmetric junction structure, the halo ion implantation region according to the present invention serves to adjust the threshold voltage of the drain region and the NM2 ion implantation region serves to reduce the contact resistance of the drain region. This increases the dopant diffusion of the threshold voltage adjust region corresponding to the drain region to thus enable it to reduce the impurity dopant dose of the corresponding region.

It is to be understood that the present invention is not limited to the above-mentioned embodiment and that various changes and modifications can be effected therein by one skilled in the art without departing from the scope of the present invention as defined in the appended claims.

As described above, the present invention can increase the dopant diffusion of the threshold voltage adjust region by carrying out a first thermal annealing process after the ion-implantation of the impurity dopant for threshold voltage adjustment, and then carrying out a second thermal annealing process after the halo ion implantation.

Accordingly, the present invention can reduce the self-resistance (Rs) and contact resistance (Rc) of the source/drain regions in a narrow surface area since it can reduce the dopant dose of the threshold voltage adjust region while maintaining the same threshold voltage as in the prior art. Due to this, because the turn-off leakage current is decreased by the reduction of the impurity dopant dose of the threshold voltage adjust region, a TWR time in a DRAM or the like can become faster by more than 3 ns and the refresh speed in a DRAM can be improved by more than 100 ms.

What is claimed is:

1. A method for manufacturing a cell transistor of a semiconductor memory device having a threshold voltage adjust region on a semiconductor substrate, comprising the steps of:
    forming device isolation films and a well on a semiconductor substrate;
    forming a threshold voltage adjust region by ion-implanting a first conductive impurity dopant into the well of the semiconductor substrate;
    performing a first thermal annealing on the semiconductor substrate where the threshold voltage adjust region is formed, for first diffusing the first conductive impurity dopant;
    forming a gate insulating film and gate electrodes on top of the semiconductor substrate between the device isolation films;
    forming a halo ion implantation region by ion-implanting a first conductive impurity dopant into only a drain region of the semiconductor substrate exposed by the gate electrodes;
    performing a second thermal annealing on the semiconductor substrate for second additionally diffusing the first diffused first conductive impurity dopant in the threshold voltage adjust region to increase a threshold voltage of the cell transistor and diffusing the first conductive impurity dopant ion implanted in the drain region; and then
    ion-implanting a second conductive impurity dopant into the drain region of the semiconductor substrate to form a drain of the cell transistor and into a source region being positioned opposite to the drain region to form a source of the cell transistor.

2. The method of claim 1, wherein the first conductive impurity dopant is p-type impurity ions comprising boron(B), and the second conductive impurity dopant is P or As.

3. The method of claim 1, wherein the threshold voltage adjust region has a first conductive impurity dopant dose of 1.5E12 to 2E12.

4. The method of claim 1, wherein the first thermal annealing is performed for 0.1 to 120 seconds at a temperature of 800 to 1200° C.

5. The method of claim 1, wherein the halo ion implantation region has a first conductive impurity dopant dose of 1.5E12 to 2E12.

6. The method of claim 1, wherein the second thermal annealing is performed for 0.1 to 120 seconds at a temperature of 800 to 1200° C.

* * * * *